US011373863B2

(12) United States Patent
Rupp et al.

(10) Patent No.: US 11,373,863 B2
(45) Date of Patent: Jun. 28, 2022

(54) METHOD OF MANUFACTURING A SILICON CARBIDE DEVICE AND WAFER COMPOSITE INCLUDING LASER MODIFIED ZONES IN A HANDLE SUBSTRATE

(71) Applicant: Infineon Technologies AG, Neubiberg (DE)

(72) Inventors: Roland Rupp, Lauf (DE); Mihai Draghici, Villach (AT); Tobias Franz Wolfgang Hoechbauer, Villach (AT); Wolfgang Lehnert, Lintach (DE); Matteo Piccin, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/869,033

(22) Filed: May 7, 2020

(65) Prior Publication Data

US 2020/0357637 A1 Nov. 12, 2020

(30) Foreign Application Priority Data

May 8, 2019 (DE) ........................ 102019111985.5

(51) Int. Cl.

| | |
|---|---|
| ***H01L 21/02*** | (2006.01) |
| ***B23K 26/00*** | (2014.01) |
| ***H01L 21/60*** | (2006.01) |

(52) U.S. Cl.

CPC .... *H01L 21/02529* (2013.01); *B23K 26/0006* (2013.01); *H01L 21/02098* (2013.01); *H01L 2021/60112* (2013.01)

(58) Field of Classification Search

None

See application file for complete search history.

(56) References Cited

U.S. PATENT DOCUMENTS

2018/0056440 A1 3/2018 Yamamoto et al.
2019/0337100 A1* 11/2019 Richter ............. B23K 26/0006

FOREIGN PATENT DOCUMENTS

WO 2016083610 A2 6/2016

* cited by examiner

*Primary Examiner* — Alexander G Ghyka

(74) *Attorney, Agent, or Firm* — Murphy, Bilak & Homiller, PLLC

(57) ABSTRACT

A wafer composite includes a handle substrate, an auxiliary layer formed on a first main surface of the handle substrate, and a silicon carbide structure formed over the auxiliary layer. The handle substrate is subjected to laser radiation that modifies crystalline material along a focal plane in the handle substrate. The focal plane is parallel to the first main surface. The auxiliary layer is configured to stop propagation of microcracks that the laser radiation may generate in the handle substrate.

12 Claims, 8 Drawing Sheets

METHOD OF MANUFACTURING A SILICON CARBIDE DEVICE AND WAFER COMPOSITE INCLUDING LASER MODIFIED ZONES IN A HANDLE SUBSTRATE

TECHNICAL FIELD

Examples of the present disclosure relate to a method of manufacturing a silicon carbide device, wherein the method includes a laser radiation of a handle substrate. Further examples refer to a wafer composite with modified zones in a detachment zone of a handle substrate.

BACKGROUND

Fabrication of semiconductor wafers typically includes forming crystal ingots by vertical zone melting or by pulling a seed crystal rod from a crucible which is filled with molten semiconductor material. The crystal ingots are sliced, e.g. by sawing. Other processes obtain epitaxial semiconductor wafers by forming a thin release layer on or close to a top of a re-usable handling wafer, epitaxially growing a semiconductor layer above the release layer and then mechanically detaching the epitaxially grown semiconductor layer from the handling wafer along the release layer.

There is a need for improved methods providing substrates for silicon carbide devices in an economical way.

SUMMARY

An embodiment of the present disclosure relates to a method of manufacturing a silicon carbide device. The method includes providing a wafer composite that includes a handle substrate, an auxiliary layer and a silicon carbide structure. The auxiliary layer is formed on a first main surface of the handle substrate. The silicon carbide structure is formed over the auxiliary layer. The handle substrate is subjected to laser radiation. The laser radiation modifies crystalline material along a focal plane in the handle substrate. The focal plane is parallel to the main surface. The auxiliary layer is configured to stop propagation of microcracks that the laser radiation generates in the handle substrate.

Another embodiment of the present disclosure relates to a wafer composite that includes a handle substrate, an auxiliary layer and a silicon carbide structure. The handle substrate includes modified zones embedded in crystalline silicon carbide. The modified zones are arranged in a detachment zone, wherein the detachment zone extends parallel to a first main surface of the handle substrate. The auxiliary layer is formed on the first surface of the handle substrate. In the handle substrate, microcracks extend from the modified zones to the auxiliary layer and end at the auxiliary layer. The silicon carbide structure is formed over the auxiliary layer.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a wafer composite and of a method of manufacturing a silicon carbide device and together with the description serve to explain principles of the embodiments. Further embodiments are described in the following detailed description and the claims.

DETAILED DESCRIPTION

Figure 1A:
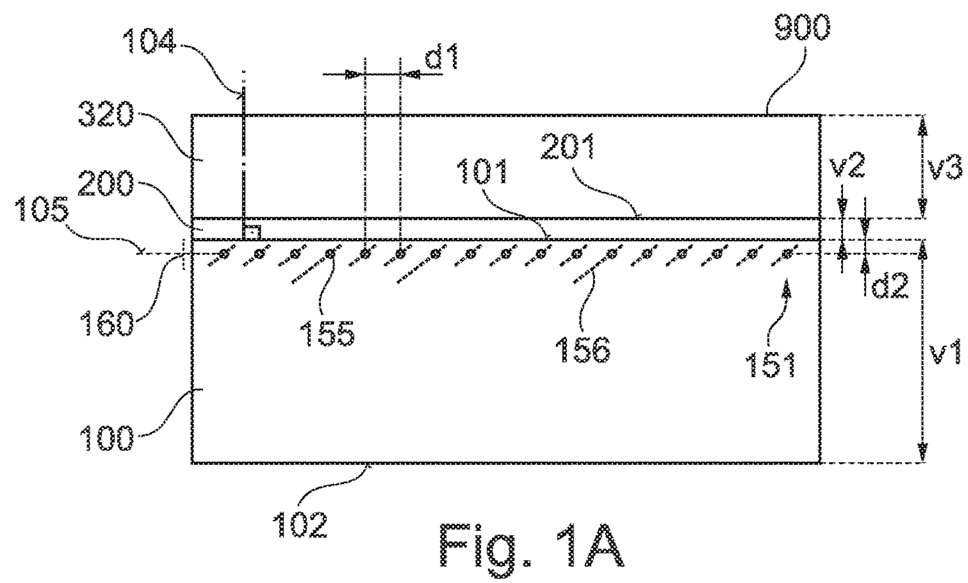
FIGS. 1A-1C show schematic vertical cross-sectional views of a wafer composite for illustrating a silicon carbide device manufacturing method that includes laser treatment in a focal plane close to a first main surface of a handle substrate according to an embodiment.

In the following detailed description, reference is made to the accompanying drawings, which form a part hereof and in which are shown by way of illustrations specific embodiments in which a wafer composite and a method of manufacturing a silicon carbide device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

Ranges given for physical dimensions include the boundary values. For example, a range for a parameter y from a to b reads as $a \leq y \leq b$. The same holds for ranges with one boundary value like "at most" and "at least".

Main constituents of a layer or a structure from a chemical compound or alloy are such elements which atoms form the chemical compound or alloy. For example, silicon (Si) and carbon (C) are the main constituents of a silicon carbide (SiC) layer.

The term "on" is not to be construed as meaning only "directly on". Rather, if one element is positioned "on" another element (e.g., a layer "on" another layer or "on" a substrate), a further component (e.g., a further layer) may be positioned between the two elements (e.g., a further layer may be positioned between a layer and a substrate if the layer is "on" said substrate).

According to an embodiment a method of manufacturing a silicon carbide device includes providing a wafer composite, wherein the wafer composite may include a handle substrate, an auxiliary layer formed on the handle substrate, and a silicon carbide structure formed over the auxiliary layer.

The handle substrate may be a crystalline silicon carbide substrate or may comprise a crystalline silicon carbide substrate. For example, the silicon carbide crystal of the handle substrate may have a hexagonal polytype, e.g. 4H or 6H. The handle substrate may be homogeneously doped or may include differently doped SiC layer portions. The handle substrate may include one or more layers from another material with a melting point close to or higher than crystalline silicon carbide. For example, the layers from another material may be embedded in the crystalline silicon carbide substrate.

The handle substrate may have two essentially parallel main surfaces of the same shape and size and a lateral surface area connecting the edges of the two main surfaces. For example, the handle substrate may be a rectangular prism with or without rounded edges or a right cylinder or a slightly oblique cylinder (e.g. where the sides lean with an angle of at most 8° or at most 5° or at most 3°) with or without one or more flats or notches along the outer circumference.

The handle substrate and/or the wafer composite structure may laterally extend in a plane spanned by lateral directions (also called "horizontal directions"). Perpendicular to the lateral directions, in a vertical direction, the handle substrate and/or the wafer composite structure may have a thickness that is small compared to the respective extension of the handle substrate and/or the wafer composite structure in the lateral directions. The lateral directions may run parallel to the main surfaces or may enclose an angle of at most 10° or at most 8° or at most 5° with at least one of the main surfaces.

The auxiliary layer may be formed directly on the first main surface of the handle substrate. The auxiliary layer may be configured to stop propagation of microcracks in the handle substrate. To this purpose, the auxiliary layer and the handle substrate may have different crystal properties. For example, the auxiliary layer and the handle substrate may be crystalline materials with different lattice constants. In other embodiments, the auxiliary layer and the handle substrate may comprise or consist of different polytypes of the same semiconductor material or may even comprise or consist of different materials. For example, the auxiliary layer and the handle substrate may differ in at least one main constituent.

The silicon carbide structure may be formed over, e.g. directly on, a layer surface of the auxiliary layer at a side opposite to the handle substrate. Horizontal cross-sectional areas of the auxiliary layer and the silicon carbide structure may be equal or approximately equal to the horizontal cross-sectional area of the handle substrate in size and shape.

The silicon carbide structure may include one or more differently doped single-crystalline SiC sublayers. In one or more of the SiC sublayers, doped regions of functional elements such as diodes and/or transistors may be formed.

The handle substrate is subjected to laser radiation. The laser radiation may modify the crystalline SiC material along a focal plane in the handle substrate. The focal plane is parallel to the first main surface. The modified single-crystalline material may form laterally separated modified zones embedded in not-modified crystalline SiC material, e.g. in not-modified single-crystalline SiC material.

The modified zones may include silicon carbide in a crystal phase that differs from the crystal phase of the not-modified SiC material, the modified zones may include silicon carbide with a polytype that differs from the polytype of the not-modified SiC material, and/or the modified zones may include decomposed silicon and carbon.

Formation of the modified zones may exert mechanical stress on the surrounding crystalline SiC material. For example, a partial decomposition of SiC in silicon and carbon may result in a temporary volume expansion of the decomposed constituents. The resulting mechanical stress may generate crystal lattice defects (so-called microcracks or fissures). At least some of the lattice defects may propagate along main crystal planes, for example, along the <0001> crystal plane (c-plane) in 4H—SiC.

The c-plane may be tilted to the focal plane, e.g. by an off-axis angle $\alpha$ in a range from 2° to 8°, e.g. by about 4°. The microcracks extending along parallel c-planes facilitate a splitting of the wafer composite along a serrated fracture surface around the focal plane by applying moderate mechanical or thermomechanical stress, wherein the fracture surface includes sections of c-planes with microcracks.

Typically, the fissures and microcracks propagate much deeper into the surrounding single-crystalline material than it is required for a reliable and reproducible separation process along the fracture surface. A maximum length of the microcracks along the c-plane multiplied with the sine of the off-axis angle $\alpha$ between the c-plane and the horizontal plane determines a vertical extension of a detachment zone. The detachment zone includes a vertical section of the handle substrate including microcracks.

The auxiliary layer may be configured to stop propagation of the microcracks. For this, a distance between the focal plane and the auxiliary layer may be sufficiently small such that microcracks generated by the laser radiation in and/or close to the focal plane can reach the auxiliary layer. The auxiliary layer may stop the propagation of fissures and microcracks into direction of the silicon carbide portion. The auxiliary layer may shield the silicon carbide portion against lattice defects induced by the laser radiation and may reduce the portion of crystalline silicon carbide that is affected by the laser radiation.

According to an embodiment the wafer composite may be split along the focal plane. The split process may include applying moderate mechanical sheer stress, thermomechanical stress, and/or acoustic waves, e.g. ultrasound, to the wafer composite. The split does not follow exactly the focal plane but follows a fracture surface with sections on both sides of the focal plane. The focal plane approximates a flat mean plane of the fracture surface. The fracture surface may be serrated (also called: sawtooth-shaped or ribbed). Parallel surface sections that are shifted to one another may build the serrated shape. The predominant portion of the surface sections of the fracture surface may be c-planes, wherein the surface sections are tilted to the horizontal focal plane.

The split process may separate an epitaxy wafer from a reclaim portion of the handle substrate. The epitaxy wafer may include the silicon carbide structure, the auxiliary layer, and a first residual layer of the detachment zone. The reclaim portion of the handle substrate may include a second residual layer of the detachment zone.

The second residual layer may be removed from the reclaim portion of the handle substrate. Removal of the second residual layer may include CMP, lapping and/or grinding, by way of example. Other polishing and/or surface smoothing methods may also be used. After removal of the second residual layer, the re-worked handle substrate may be free or almost free of crystal fissures and cracks originating from the laser treatment. The re-worked handle substrate may be used as handle substrate of a further wafer composite.

Since the auxiliary layer stops the propagation of cracks from the handle substrate to the silicon carbide structure, the silicon carbide structure may be without crystal defects originating from the laser separation even if the focal plane is provided in close vicinity to the first main surface of the handle substrate. The handle substrate can be used more efficiently than without auxiliary layer.

According to an embodiment a portion of the handle substrate extending from the first surface of the handle substrate to the focal plane may include single crystalline silicon carbide. For example, the portion of the handle substrate extending from the first surface of the handle substrate to the focal plane may consist of single crystalline silicon carbide. The auxiliary layer may effectively restrict the vertical extension of the microcracks in silicon carbide to a minimum value necessary for the subsequent wafer split.

According to an embodiment, the laser radiation may form the modified zones along parallel laser scan lines. Neighboring laser scan lines may have a center-to-center distance, in particular the same center-to-center distance.

For example, for modified zones formed in 4H—SiC and at an off-axis angle α of about 4° between the c-plane and the horizontal plane, the distance between the focal plane and the auxiliary layer may be in a range from 3.2% to 14.3% of the center-to-center distance of the laser scan lines. For example, the distance between the focal plane and the auxiliary layer may be in a range from 3.2% to 7.15% or from 6.4% to 14.3% of the center-to-center distance of the laser scan line.

As a result, the distance between the focal plane and the auxiliary layer is sufficiently large such that cracks induced by neighboring laser scan lines are sufficiently close to each other for ensuring a reliable separation process. On the other hand, the distance between the focal plane and the auxiliary layer is sufficiently small to facilitate a highly material-efficient separation process, which may come along with very few loss of crystalline SiC material.

According to an embodiment the auxiliary layer may include at least one compressively stressed layer. For example, the auxiliary layer may include one single compressively stressed layer. According to another example, the auxiliary layer may include a plurality of compressively stressed sublayers and sublayers under tensile stress, wherein sublayers under tensile stress and sublayers under compressive stress alternate along the vertical direction. Layers under compressive stress may stop the propagation of cracks and/or lattice defects. The compressively stressed sublayers and the sublayers under tensile stress may be single-crystalline SiC layers with different mean dopant concentrations and may be formed in an efficient way by epitaxy using in-situ doping.

According to an embodiment the auxiliary layer may have a melting point above 1800° C. An auxiliary layer with high temperature stability makes it possible to form the silicon carbide structure over the auxiliary layer at least partly by epitaxy. For example, the auxiliary layer may include a silicon nitride layer and/or a carbon layer and/or polycrystalline SiC. The auxiliary layer may consist of one of these layers or a combination of these layers.

According to an embodiment, the auxiliary layer may include at least one silicon carbide layer with a significantly higher dopant concentration than in a directly adjoining layer portion of the handle substrate. The auxiliary layer may be formed from a portion of the handle substrate, e.g. by introducing dopants, or by in-situ doping during epitaxial growth. For example, the mean dopant concentration in the auxiliary layer may be at least ten times as high as in the directly adjoining layer portion of the handle substrate.

According to an embodiment providing the wafer composite may include forming the auxiliary layer on at least one of the first main surface of the handle substrate and a working surface of a SiC donor substrate. For example, the auxiliary layer may be exclusively formed on the handle substrate, may be exclusively formed over the donor substrate, or may include two sublayers, wherein a first sublayer is formed on the first main surface of the handle substrate and a second sublayer is formed on the working surface of the SiC donor substrate.

Then the handle substrate and the SiC donor substrate may be connected, e.g. by bonding, wherein the auxiliary layer is arranged between the handle substrate and SiC donor substrate.

For example, the handle substrate and the SiC donor substrate may be connected by direct bonding or by reactive bonding. Adhesion between directly bonded layers and substrates may be based on chemical bonds, hydrogen bonds, metallic bonds, ionic bonds and/or covalent bonds.

Direct bonding may include exerting a physical force pressing the SiC donor substrate and the handle substrate against each other, a thermal treatment of at least one of the bonded surfaces at moderate temperature or a combination of both (fusion bonding, thermo-compressive bonding, bonding by atomic rearrangement). Direct bonding may include the absence of any additional intermediate layer, for example, of an adhesive layer. Firmly connecting the SiC donor substrate to the handle substrate may facilitate the transfer of a transfer layer from the SiC donor substrate to the wafer composite.

According to an embodiment, a reclaim portion of the SiC donor substrate may be separated from a transfer portion of the SiC donor substrate after physically connecting the handle substrate and the SiC donor substrate. For example, the SiC donor substrate may include a release layer between the reclaim portion and the transfer portion. The SiC donor substrate may be split along the release layer, wherein the reclaim portion is separated from the transfer layer. The release layer may include crystal defects or voids generated by implanting light ions, for example hydrogen and/or helium through the working surface of the SiC donor substrate. The separation process may include a thermal treatment regrouping the silicon and carbide atoms in the release layer.

According to an embodiment, an epitaxial silicon carbide layer may be formed on the transfer portion after removal of the reclaim portion. For example, silicon carbide may be deposited by a chemical vapor deposition method, wherein the silicon and carbon atoms grow in registry with the single-crystalline lattice of the transfer portion. In the epitaxial silicon carbide layer, semiconductor dies for integrated circuits may be formed, for example, for power semiconductor devices. In particular, silicon carbide devices can be formed exclusively in epitaxial grown silicon carbide at a minimum loss of crystalline silicon carbide from the handle substrate.

According to an embodiment, the handle substrate may include a main portion, a separation layer formed over, e.g. directly on the main portion and an intermediate layer over, e.g. directly, on the separation layer. The laser radiation may be performed with a focal plane within the intermediate layer.

The main portion may be or may include crystalline silicon carbide, e.g. single-crystalline carbide.

The separation layer may be or may include a compressively stressed layer, for example a silicon carbide layer with a higher dopant concentration than a mean concentration in the intermediate layer and in a layer portion of the main portion directly among the separation layer. According to another example, the separation layer may include at least one main constituent different from silicon and carbon. For example, the separation layer may include a silicon nitride layer.

The separation layer may be one single, homogenous layer. According to another example, the separation layer may include a plurality of compressively stressed sublayers and a plurality of sublayers under tensile stress, wherein sublayers under tensile stress and sublayers under compressive stress alternate along the vertical direction. Compressively stressed layers may stop the propagation of cracks and/or lattice defects. The compressively stressed sublayers and the sublayers under tensile stress may be single-crystalline SiC layers with different mean dopant concentrations and may be formed in an efficient way by epitaxy.

The intermediate layer may be provided from a single-crystalline or polycrystalline material with a melting point above 1800° C., with sufficient adhesion on the separation layer and susceptible for being modified by laser radiation. For example, the intermediate layer may be a silicon carbide layer with a hexagonal lattice type, e.g. a 4H—SiC layer with an off-axis angle $\alpha$ of about 4° between the c-plane and the horizontal plane. For example, the intermediate layer may be a layer under tensile stress.

The separation layer in the handle substrate may stop propagation of cracks from the modified zones in the intermediate layer into direction of the handle substrate and further reduces the loss of single-crystalline silicon carbide material.

According to an embodiment the intermediate layer may be formed by layer transfer from the SiC donor substrate or from an alternative donor substrate. The layer transfer facilitates to provide the intermediate layer from materials that otherwise may not be formed on the separation layer, e.g. single-crystalline materials, or materials that can be formed on the separation layer only at high effort.

For example, the intermediate layer may be a single-crystalline silicon carbide layer. A mean dopant concentration in the intermediate layer may be comparatively high, for example, greater than in the main portion. A higher dopant concentration may improve the formation of microcracks along the c-planes. A thickness of the intermediate layer may be at least 6.4% and at most 14.5% of the center-to-center distance between the laser scan lines.

By providing the intermediate layer from a material other than single-crystalline silicon carbide, silicon carbide devices may be obtained without loss of single-crystalline silicon carbide at all. In case the intermediate layer is provided from single-crystalline silicon carbide, the intermediate layer may be formed from an alternative SiC donor substrate with a lower crystal quality or from another polytype than the silicon carbide donor substrate that provides the seed layer for epitaxial growth.

According to another embodiment a wafer composite may include a handle substrate, an auxiliary layer, and a silicon carbide structure. The handle substrate may include modified zones of modified material embedded in single-crystalline silicon carbide. The modified zones are formed in a detachment zone. The detachment zone is parallel to a first main surface of the handle substrate. The auxiliary layer may be formed on, e.g. directly on the first main surface of the handle substrate. The silicon carbide structure may be formed over, e.g. directly on the auxiliary layer. In the handle substrate, microcracks may extend from the modified zones to the auxiliary layer and may end at the auxiliary layer, e.g. at an interface between the auxiliary layer and the handle substrate.

The auxiliary layer facilitates that the modified zones can be formed at a comparatively small distance to the first main surface of the handle substrate. The auxiliary layer may restrict the length of cracks propagating from the modified zones into direction of the silicon carbide structure alone crystal planes, which are tilted to the main surface.

According to an embodiment the modified zones may be formed in parallel laser scan lines that have center-to-center distance to each other. A distance between the auxiliary layer and a focal plane through centers of the modified zones may be in a range from 3.2% to 7.25% of the center-to-center distance of the laser scan lines.

At a distance of the modified zones to the auxiliary layer in the given range, it is possible that only a small portion of single-crystalline silicon carbide is lost in a splitting process, while at the same time a reliable splitting of the detachment zone around the focal plane is still possible.

According to an embodiment the auxiliary layer may be compressively stressed. Compressively stressed layers may stop the propagation of cracks along main crystal planes with sufficient reliability.

According to an embodiment the auxiliary layer may have a melting point above 1800° C. At least a portion of the silicon carbide structure may be formed by epitaxy at temperatures up to 1800° C. For example, the auxiliary layer may include a silicon nitride layer or a silicon carbide layer.

According to an embodiment the silicon carbide structure may include an epitaxial layer. The epitaxial layer may include a wafer-like composite including a plurality of laterally connected semiconductor dies for integrated circuits, for example, for power semiconductor devices, at any stage of processing. For example, the epitaxial layer may include the doped regions of the integrated circuits, or the doped regions of integrated circuits and further dielectric and conductive structures from non-single semiconducting materials.

According to an embodiment the handle substrate may include a main portion, a separation layer formed over, e.g. directly on the main portion and an intermediate layer formed over, e.g. directly on the separation layer. The modified zones may be formed in the intermediate layer. The intermediate layer and the handle substrate may be from other materials than almost defect-free single-crystalline silicon carbide. The main portion and the separation layer of the handle substrate are not consumed and re-usable for the same purpose after separation along the focal plane and after removing residuals of the intermediate layer.

According to an embodiment the intermediate layer may be a single-crystalline silicon carbide layer under tensile stress. For example, a mean dopant concentration in the intermediate layer may be comparatively high, for example, greater than in the main portion. Tensile stress may improve the formation of microcracks along the c-planes.

The thermo-mechanical behavior of the intermediate layer is matched to the characteristics of the silicon carbide structure. Since the intermediate layer is not used as seed for epitaxy, the intermediate layer may be a silicon carbide layer of inferior crystal quality.

Figure 1B:
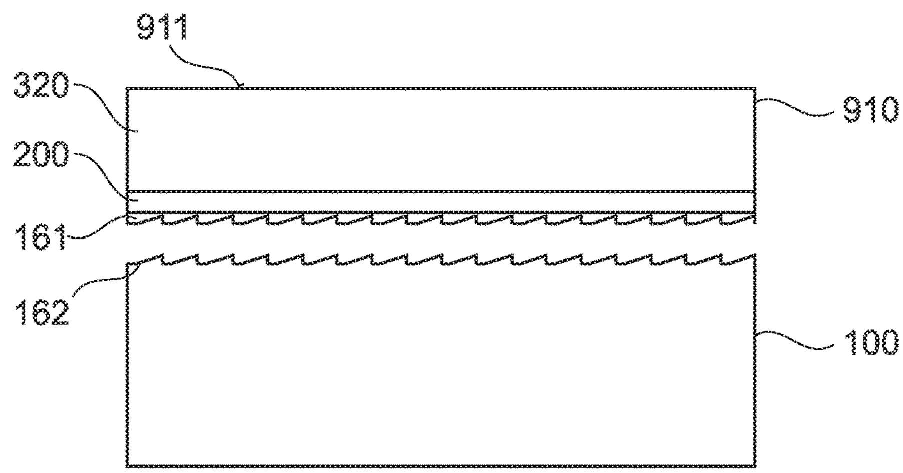
Figure 1C:
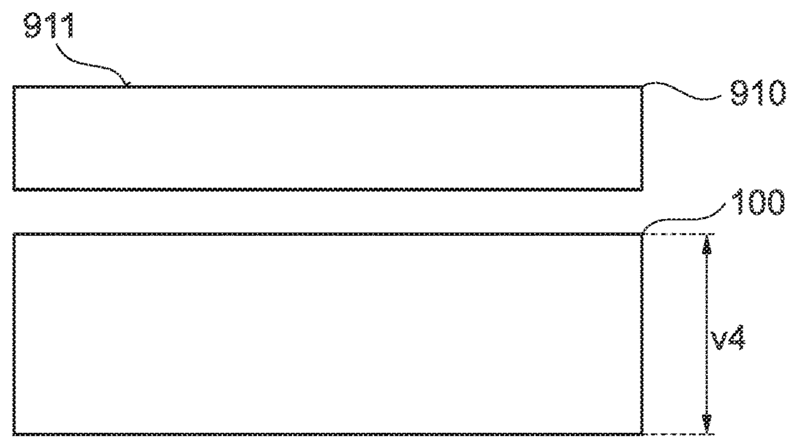

FIGS. 1A to 1C illustrate a method that facilitates the manufacturing of silicon carbide devices from an epitaxial silicon carbide wafer 910.

FIG. 1A shows a wafer composite 900 with a handle substrate 100, an auxiliary layer 200 and a silicon carbide structure 320 vertically stacked upon each other.

The handle substrate 100 may be a flat plate with two parallel main surfaces 101, 102. A horizontal cross-section of the handle substrate 100 parallel to the first main surface 101 at a front side of the handle substrate 100 may be a polygon with or without rounded corners or may be an ellipse, e.g. a circle, wherein the handle substrate 100 may have notches and/or flats formed along the circumference. For example, the cross-section of the handle substrate 100 may be a circle with a notch or a flat along the circumference or without flat and notch, wherein a diameter of the circle corresponds to the diameter of a standard wafer size. For example, the diameter may be 2-inch (51 mm), 3-inch (76 mm), 4-inch (100 mm), 125 mm (5 inch), 150 mm (6-inch) or 200 mm (8-inch).

The handle substrate 100 may be completely from a silicon carbide crystal including silicon and carbon as main constituents or may include at least a crystalline silicon carbide portion. The silicon carbide crystal may include further materials in addition to silicon and carbon, for example, unintentional impurities as a result of material and process imperfections and/or unintentional additives. Unintentional impurities may include oxygen (O) and fluorine (F). Intentional additives may include hydrogen (H) and/or dopant atoms, e.g., nitrogen (N), phosphorous (P), beryllium (B), boron (B), aluminum (Al), and/or gallium (Ga). A surface normal 104 of the first main surface 101 may define and/or run along a vertical direction. Directions orthogonal to the vertical direction are lateral directions (also called horizontal directions).

A thickness v1 of the handle substrate 100 between the two main surfaces 101, 102 may be equal to, smaller than or greater than a thickness of a standard silicon carbide wafer of the same diameter. For example, the diameter of the handle substrate 100 may be 4 inch and the handle substrate thickness v1 may be equal to, smaller than or greater than 525 μm.

The auxiliary layer 200 may be formed in contact with the first main surface 101 of the handle substrate 100. The auxiliary layer 200 may be compressively stressed. A melting point of the auxiliary layer 200 may be above 1800° C. A thickness v2 of the auxiliary layer 200 may be in a range from 5 nm to 5 μm, for example 20 nm to 0.5 μm. For example, the auxiliary layer 200 may be or may include a silicon carbide layer with a higher dopant concentration than in a directly adjoining layer portion of the handle substrate 100. According to another example, the auxiliary layer 200 may be or may include a silicon nitride layer.

The silicon carbide structure 320 may be in contact with a layer surface 201 of the auxiliary layer 200, wherein the layer surface 201 is opposite to the handle substrate 100. The silicon carbide structure 320 may be at least partly formed by epitaxy. The silicon carbide structure 320 may be a composite of a plurality of identical, laterally connected semiconductor dies, wherein each semiconductor die includes a semiconductor body of an integrated circuit, e.g. the semiconductor body of a power semiconductor device. A thickness v3 of the silicon carbide structure 320 may be in a range from 20 μm to several hundred μm.

The handle substrate 100 includes modified zones 155. The modified zones 155 are formed from the material of the handle substrate 100 by applying laser radiation focusing in a focal plane 105 in the handle substrate 100.

The focal plane 105 is close to the first main surface 101. For example, in a handle substrate 100 with a hexagonal crystal lattice and with an off-axis angle α of about 4° between the horizontal plane and a main crystal plane, for example, the c-plane, a distance d2 between the main surface 101 and the focal plane 105 may be in a range from 100 nm to 800 μm, typically from 500 nm to 40 μm, from 200 nm to 20 μm, or from 1 μm to 20 μm.

The modified zones 155 may be arranged in laser scan lines 151. The laser scan lines may extend orthogonal or tilted to the cross-sectional plane. A center-to-center distance d1 between neighboring laser scan lines 151 may be in a range from 10 μm to 200 μm, for example in a range from 40 μm to 100 μm.

From the modified zones 155 microcracks 156 may predominantly extend along c-planes that intersect the modified zones 155 or that pass by the modified zones 155 in close vicinity. A vertical section of the handle substrate 100 defined by the length of the microcracks 156 forms a detachment zone 160.

The laser radiation may be applied from the front side, for example, after an epitaxy process that forms at least a part of the silicon carbide structure 320 and prior to forming a metallization of the semiconductor dies. Alternatively, the laser radiation may be applied from the rear side, for example, after the epitaxy process that forms at least a part of the silicon carbide structure 320, e.g. after completing a front side processing of the silicon carbide structure, in particular, after forming a front side metallization of the semiconductor dies.

The wafer composite 900 may be split along the focal plane 105. For example, mechanical shear stress may be applied between the silicon carbide structure 320 and the handle substrate 100. Applying mechanical shear stress may be combined with a further process supporting the split. For example, thermomechanical stress may be applied by cooling. Alternatively or in addition, acoustic waves, e.g. ultrasound, may be directed to the detachment zone 160.

The focal plane 105 determines the vertical position of the split. The split does not directly follow the focal plane 105. Instead, the split predominantly follows parallel sections of c-planes in the detachment zone 160.

FIG. 1B shows an epitaxial wafer 910 split off from the handle substrate 100. The epitaxial wafer 910 includes the silicon carbide structure 320, the auxiliary layer 200 and a first residual layer 161 of the detachment zone 160 of FIG. 1A. The handle substrate 100 includes a second residual layer 162 of the detachment zone 160 of FIG. 1A.

Fracture surfaces 157 of the epitaxial wafer 910 and of the handle substrate 100 are mainly composed of parallel surface sections in c-planes. From the surface sections in the c-planes, microcracks 156 may extend into the first and second residual layers 161, 162.

The epitaxial wafer 910 is further processed. For example, the first residual layer 161 is removed and, if applicable, the auxiliary layer 200 may be removed. During the split and during further processes, an auxiliary carrier may be temporarily attached to a front side surface 911 of the epitaxial wafer 910.

The handle substrate 100 may be re-worked. For example, the second residual layer 162 may be removed from the front side of the handle substrate 100. Removal of the second residual layer 162 may include chemical-mechanical polishing, lapping and/or grinding, by way of example.

FIG. 1C shows the re-worked handle substrate 100 and the further processed epitaxial wafer 910. A thickness v4 of the re-worked handle substrate 100 is smaller than the vertical extension v1 of the handle substrate 100 before the splitting.

Figure 2A:
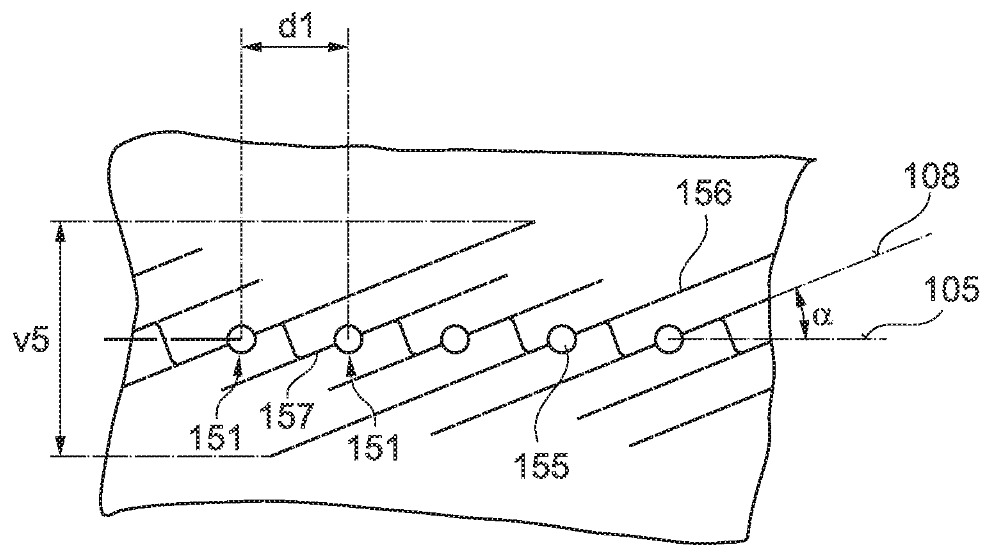
FIG. 2A shows a schematic vertical cross-sectional view of a portion of a silicon carbide substrate with modified zones formed by laser radiation for discussing effects of the embodiments.
Figure 2B:
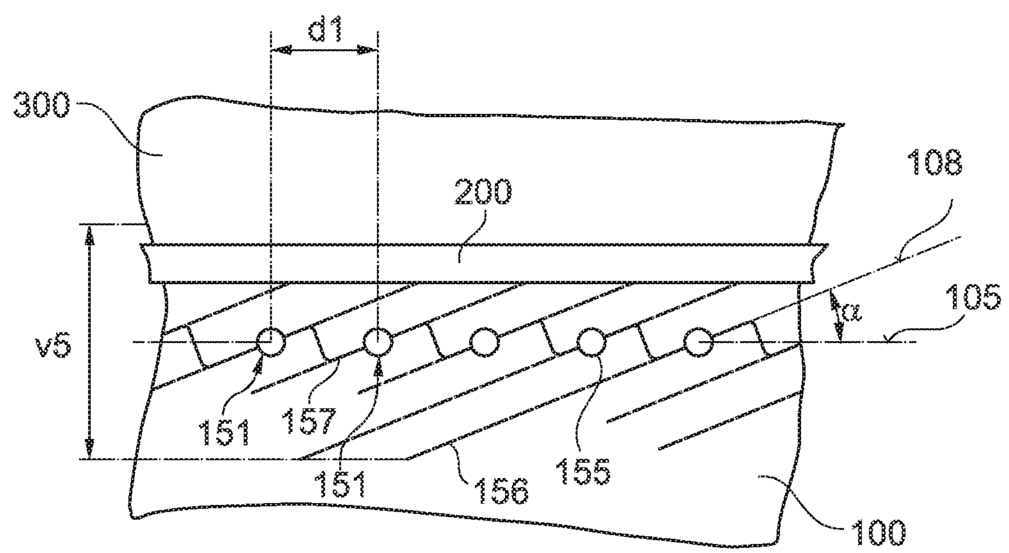
FIG. 2B illustrates a schematic vertical cross-sectional view of a portion of a wafer composite with auxiliary layer and with modified zones in a handle substrate for discussing effects of the embodiments.

FIGS. 2A and 2B illustrate effects of the auxiliary layer 200 of FIGS. 1A to 1C.

FIG. 2A refers to a single-crystalline 4H—SiC substrate with a 4° off-axis angle α between the horizontal plane and the c-plane. Modified zones 155 are formed by laser radiation along laser scan lines 151 extending orthogonally to the cross-sectional plane. A center-to-center distance d1 between neighboring laser scan lines 151 is in the range of several micrometers. In and directly around the focal position, the laser beam may convert the single-crystalline material of the handle substrate 100 into a different polytype (e.g. from 4H—SiC to 3C—SiC) and/or into a structure of different crystallinity.

For example, the laser wafer length may be within the silicon carbide absorption gap, wherein multi-phonon interaction may result in a local decomposition of the silicon carbide crystal into silicon and carbon. The decomposition may be accompanied by a volume expansion of the modified material. The volume expansion may induce mechanical stress into the surrounding portion of the silicon carbide crystal. The stress results in lattice defects, fissures and/or microcracks 156 propagating predominantly along the c-planes 108. The microcracks 156 weaken the mechanical stability of the silicon carbide crystal in a detachment zone 160. By applying suitable mechanical stress, the handle substrate 100 splits along a separation surface 157 which is predominantly composed of parallel surface sections in c-planes 108.

The microcracks 156 along the c-planes 108 can be comparatively long. The maximum length of the microcracks 156 determines a vertical extension v5 of the detachment zone 160. Nearly no microcracks 156 are present outside the detachment zone 160. Due to the high lattice defect density and/or the microcracks 156, the detachment zone 160 is typically not usable for further processing.

A vertical section of the handle substrate 100 with a vertical extension v5 is lost for further processing. The vertical extension v5 is typically greater than 25% of the center-to-center distance d1 between neighboring laser scan lines 151. In addition, there is some risk that some microcracks 156 may extend beyond the assumed extension of the detachment zone 160.

In FIG. 2B an auxiliary layer 200 limits the propagation of microcracks 156 into direction of the silicon carbide structure 320 and shields the silicon carbide structure 320 against cracks and lattice defects generated by the laser radiation. The distance d2 between the auxiliary layer 200 and the focal plane 105 may be selected such that a reliable splitting is just feasible. A vertical extension v5 of the detachment zone 160 in FIG. 2B may be significantly smaller than the vertical extension v5 of the detachment zone 160 in FIG. 2A.

FIGS. 3A to 3F combine laser-assisted splitting of an epitaxial wafer 910 from a handle substrate 100 with a layer transfer from a SiC donor substrate 300.

Light ions may be implanted through a working surface 301 of a single-crystalline SiC donor substrate 300. The light ions may include helium (He) and/or hydrogen (H). The light ions may damage the crystal lattice in the SiC donor substrate 300 in a release layer 310.

Figure 3A:
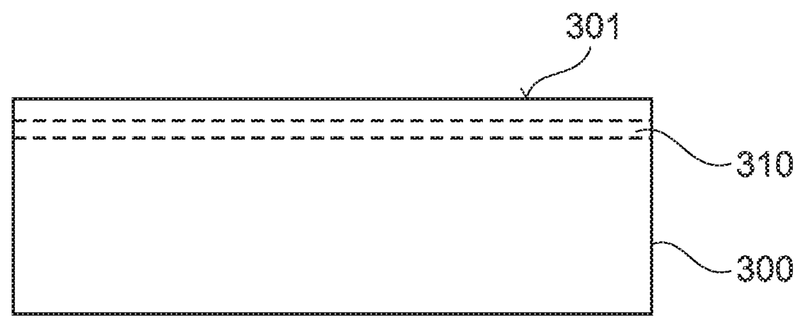
FIGS. 3A-3F show schematic vertical cross-sectional views of a donor substrate, a handling substrate and a wafer composite for illustrating a silicon carbide device manufacturing method according to an embodiment using an auxiliary layer for bonding.

FIG. 3A shows that the release layer 310 extends at uniform distance to the working surface 301 across the complete cross-sectional area of the silicon carbide donor substrate 300.

The SiC donor substrate 300 is physically connected to a handle substrate 100, for example, by bonding. To this purpose, an auxiliary layer 200 may be formed on a main surface 101 of the handle substrate 100 and the working surface 301 of the SiC donor substrate 300 is bonded to an exposed layer surface 201 of the auxiliary layer 200. Alternatively, the auxiliary layer 200 may be formed on the working surface 301 of the SiC donor substrate 300 and the main surface 101 of the handle substrate 100 may be bonded to the auxiliary layer 200. Alternatively a first sublayer of the auxiliary layer 200 may be formed on the working surface 301 of the SiC donor substrate 300 and a second sublayer may be formed on the main surface 101 of the handle substrate 100 and both sublayers may be bonded together.

Figure 3B:
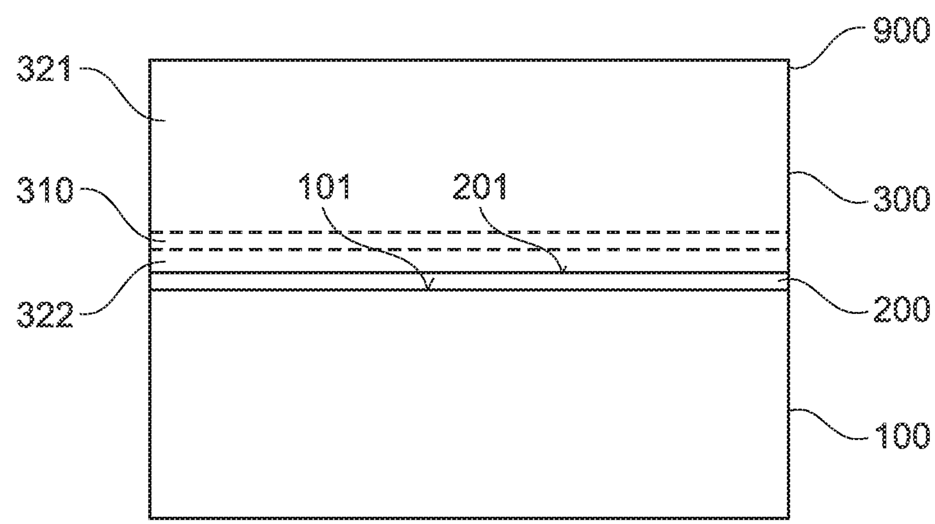

FIG. 3B shows a wafer composite 900 including the SiC donor substrate 300 physically connected to the handle substrate 100 through the auxiliary layer 200.

A reclaim portion 321 of the SiC donor substrate 300 may be separated, e.g. split off from a transfer portion 322 of the SiC donor substrate 300. For example, a thermal treatment may result in a regrouping of atoms in the release layer 310, wherein the reclaim portion 321 may be split off by applying moderate mechanical force.

Residuals of the release layer 310 on the reclaim portion 321 may be removed and the working surface 301 of the reclaim portion 321 may be planarized. The reclaim portion 321 may be used as SiC donor substrate 300 in a next process cycle.

Residuals of the release layer 310 on the wafer composite 900 may be removed and the exposed surface of the transfer portion 322 may be planarized.

Figure 3C:
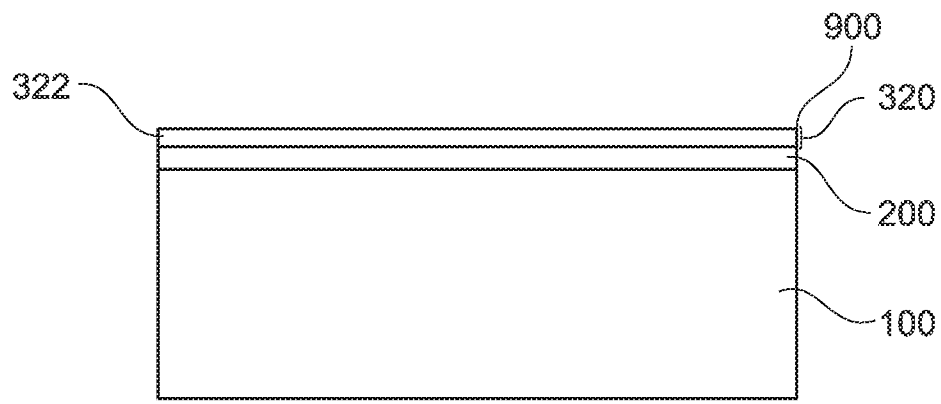

FIG. 3C shows a wafer composite 900 including the transfer portion 322 on the auxiliary layer 200. The transfer portion 322 may be used as seed layer for an epitaxial process. For example, a chemical vapor deposition process may deposit silicon and carbon atoms which deposit on the seed layer in registry with the single-crystal lattice of the transfer layer 322. The deposited silicon and carbon atoms form an epitaxial layer 324.

Figure 3D:
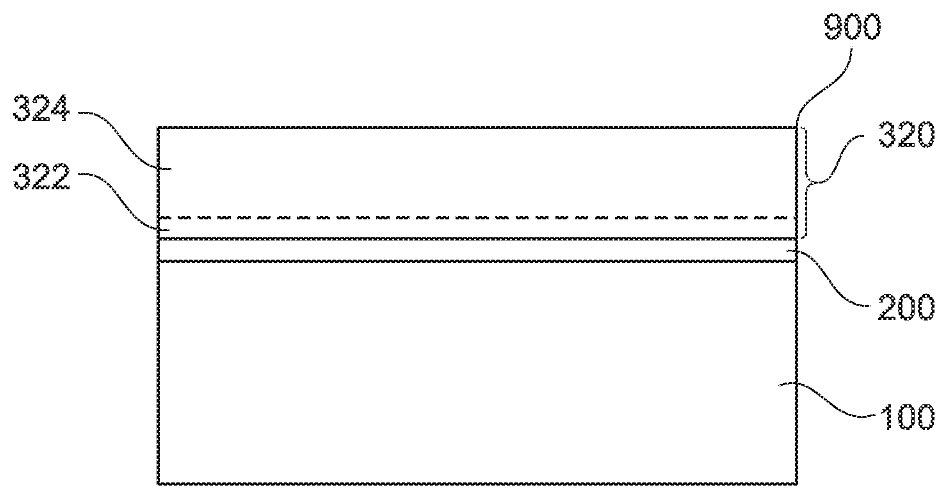

As illustrated in FIG. 3D, the transfer layer 322 and the epitaxial layer 324 form a silicon carbide structure 320 in which the semiconductor dies for a plurality of identical integrated circuits, for example, power semiconductor devices may be formed. At a suitable stage of processing, laser radiation forms a detachment zone 160 including modified zones 155 arranged along a focal plane 105.

Figure 3E:
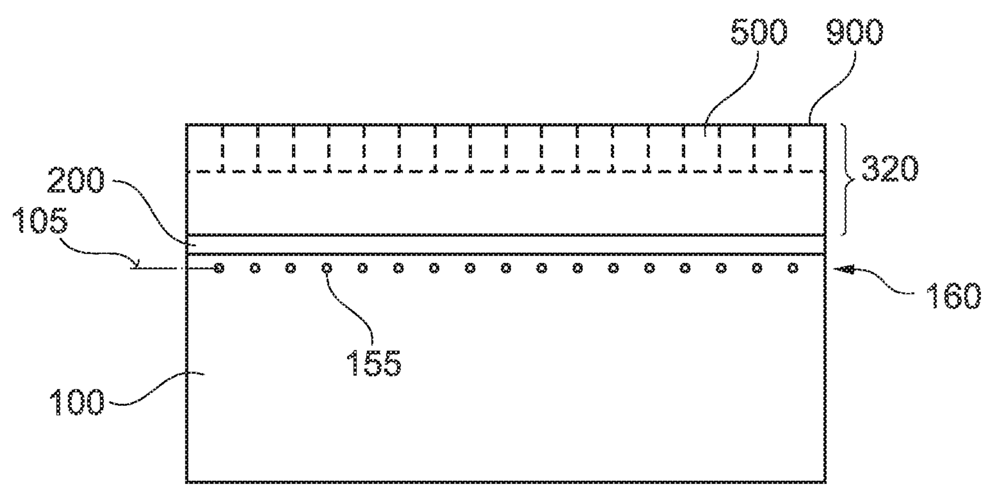

FIG. 3E schematically illustrates semiconductor dies 500 formed in at least a portion of the silicon carbide structure 320 and the modified zones 155 arranged along a focal plane 105 in the detachment zone 160.

Figure 3F:
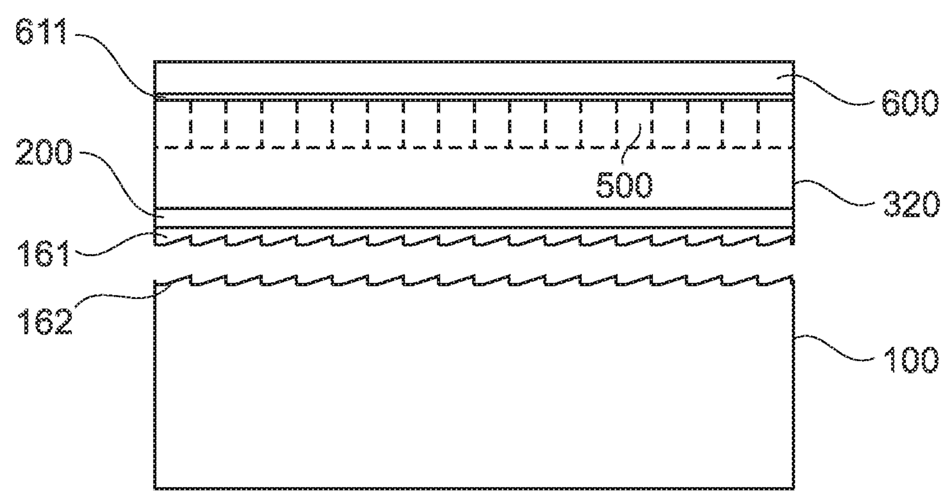

FIG. 3F schematically illustrates that an auxiliary carrier 600 may be attached to an exposed surface of the silicon carbide structure 320. For example, an adhesive layer 611 may mechanically connect the auxiliary carrier 600 and the silicon carbide structure 320. Then the silicon carbide structure 320 may be separated from the handle substrate 100 by applying moderate mechanical stress. If applicable, applying mechanical stress may be combined with a further process that locally increases mechanical stress in the detachment zone 160, for example by cooling the wafer composite 900 and/or by applying acoustic waves.

FIGS. 4A to 4E show a method that facilitates a further reduction of the vertical extension of a detachment zone 160 by providing the handle substrate 100 with a separation layer 120 prior to a layer transfer from a donor substrate.

Figure 4A:
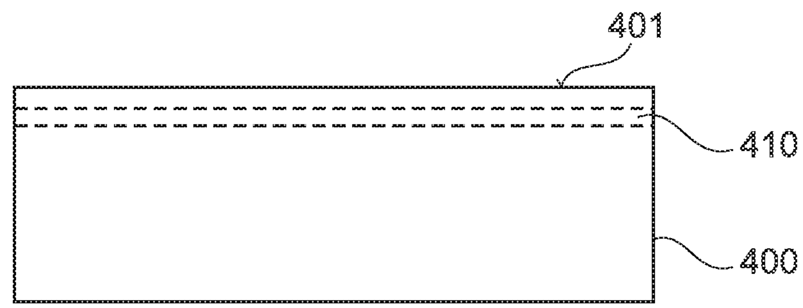
FIGS. 4A-4E show schematic vertical cross-sectional views of a donor substrate, a handle substrate and a wafer composite for illustrating a silicon carbide device manufacturing method according to an embodiment using an intermediate layer.

FIG. 4A shows an alternative donor substrate 400 which may be from or which may include single-crystalline silicon carbide or which may be from another material than single-crystalline 4H—SiC. For example, the alternative donor substrate 400 may be formed from single-crystalline SiC of a polytype different from 4H—SiC, or from a single-crystalline SiC with comparatively high crystalline defect density and/or with a comparatively high content of unintentional impurities.

Light ions may be implanted into the alternative donor substrate 400 through a working surface 401 to form a release layer 420. The alternative donor substrate 400 is firmly connected to a substrate structure 190 that includes a main portion 110 and a separation layer 120.

Figure 4B:
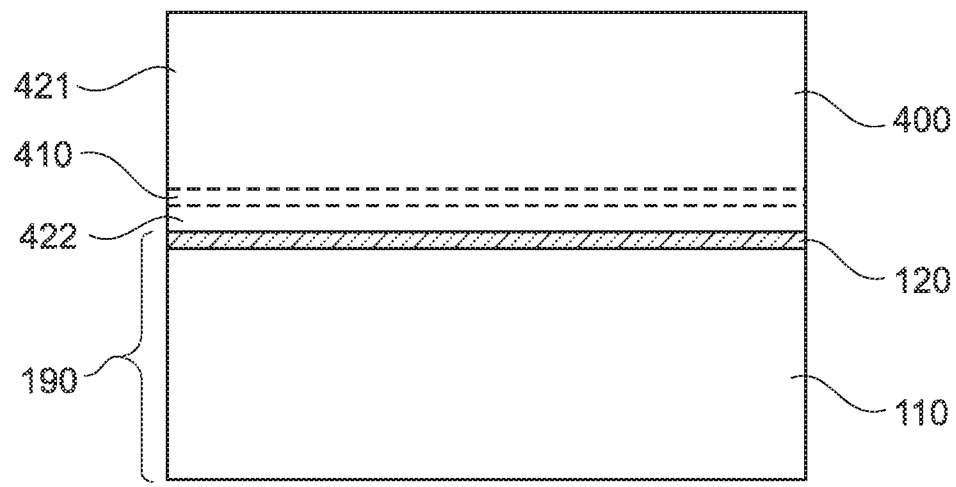

FIG. 4B shows the alternative donor substrate 400 mechanically connected, e.g. bonded to an exposed surface of the separation layer 120 of the substrate structure 190.

The main portion 110 of the substrate structure 190 may be a single-crystalline silicon carbide of an arbitrary polytype. For example, the main portion 110 may have comparatively high defect density and/or a high content of unwanted impurities.

The separation layer 120 may be a layer with high melting point, for example, with a melting point beyond 1800° C. The separation layer 120 may be or may include a compressively stressed layer. For example, the separation layer 120 may be or may include a silicon nitride layer and/or a lightly doped silicon carbide layer.

A reclaim portion 421 of the alternative donor substrate 400 is removed by splitting the alternative donor substrate 400 along the release layer 420. An exposed surface of the remaining transfer portion 422 may be planarized.

Figure 4C:
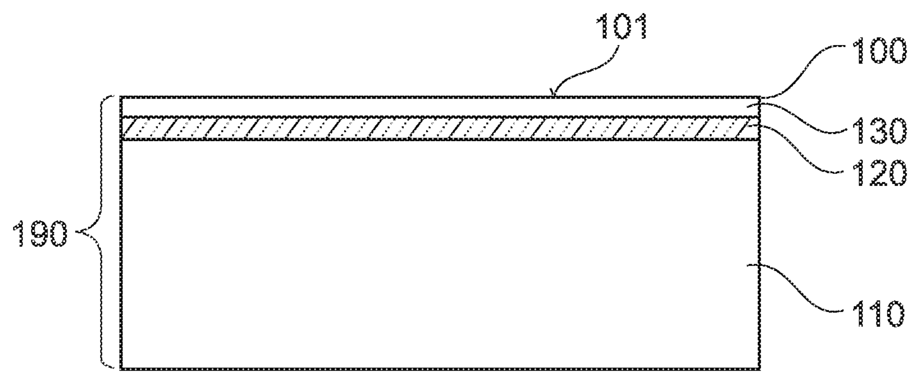

The handle substrate 100 in FIG. 4C includes the main portion 110 and the separation layer 120 of the substrate structure 190 and an intermediate layer 130 formed from the planarized transfer portion 422 of the alternative donor substrate 400 over, e.g. directly on the separation layer 120. An exposed surface of the intermediate layer 130 forms the main surface 101 of the handle substrate 100.

A release layer 320 is formed in a SiC donor substrate 300. The SiC donor substrate 300 is connected, e.g. bonded onto the main surface 101 of the handle substrate 100 through an auxiliary layer 200.

Figure 4D:
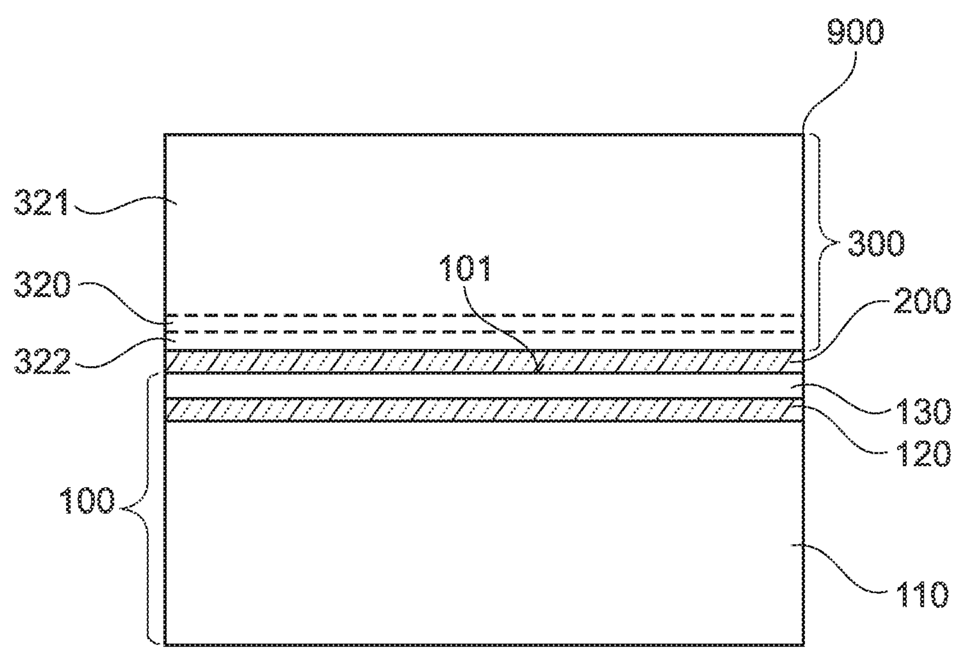

FIG. 4D shows the SiC donor substrate 300 physically connected to the handle substrate 100 through the auxiliary layer 200.

A reclaim portion 321 of the SiC donor substrate 300 may be split off. The remaining transfer portion 322 may be planarized. An epitaxial layer may be formed over, e.g. directly on the planarized transfer portion 322. The epitaxial layer and the transfer portion 322 form a silicon carbide structure 320. Semiconductor dies 500 may be formed in the silicon carbide structure 320. Laser radiation forms modified zones 155 in a focal plane, wherein the focal plane 105 is in the intermediate layer 130 of the handle substrate 100. The modified zones 155 may be formed at any stage after transfer of the transfer portion 322 onto the handle substrate 100.

Figure 4E:
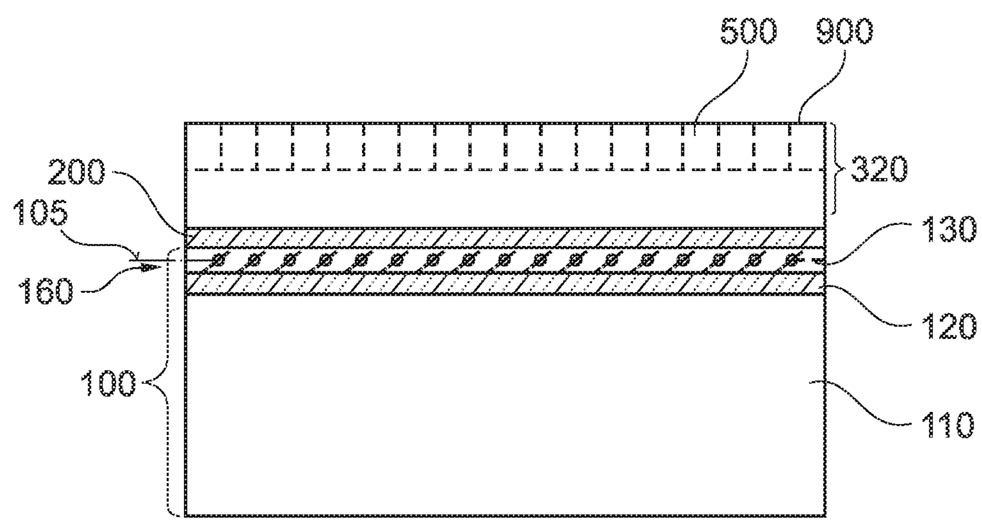

FIG. 4E shows the modified zones 155 formed in the intermediate layer 130. A vertical extension of the detachment zone 160 is restricted to the intermediate layer 130. An epitaxy wafer including the silicon carbide structure 320 may be separated from the handle substrate 100 by splitting along the detachment zone 160.

Figure 5:
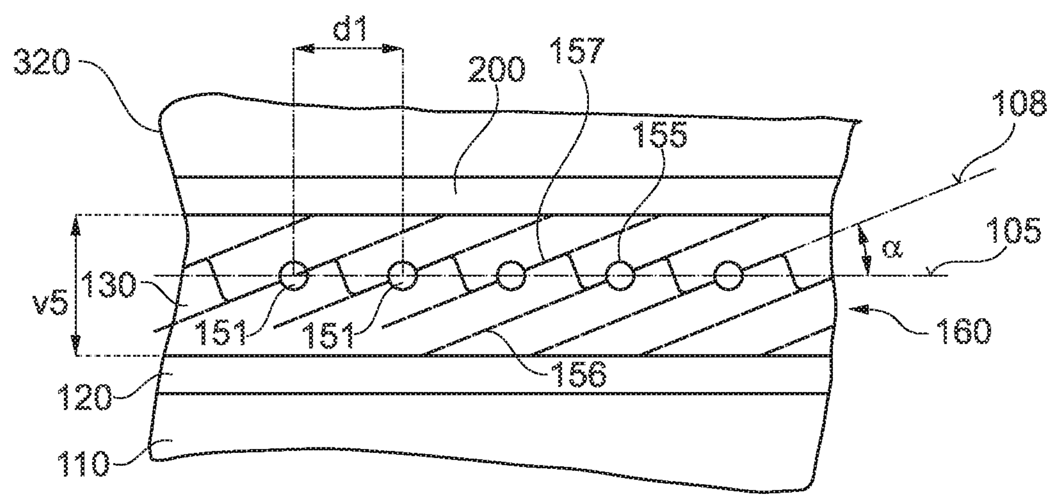
FIG. 5 is a schematic vertical cross-sectional view of a portion of a wafer composite for discussing effects of the embodiment of FIGS. 4A to 4H.

As shown in FIG. 5 the separation layer 120 limits a propagation of microcracks 156 into direction of the main portion 110 of the handle substrate 100 and shields the main portion 110 against cracks and lattice defects generated by laser radiation. An auxiliary layer 200 limits a propagation of microcracks 156 into direction of the silicon carbide structure 320 and shields the silicon carbide structure 320 against cracks and lattice defects generated by the laser radiation. The length of the microcracks 156 is restricted by the thickness of the intermediate layer 130.

The vertical extension v5 of the detachment zone 160 in FIG. 5 may be significantly smaller than the vertical extension v5 of the detachment zone 160 in FIG. 2B.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a silicon carbide device, the method comprising:

providing a wafer composite comprising a handle substrate, an auxiliary layer formed on a first main surface of the handle substrate, and a silicon carbide structure formed over the auxiliary layer; and subjecting the handle substrate to laser radiation that modifies crystalline material along a focal plane in the handle substrate, the focal plane being parallel to the first main surface, wherein the auxiliary layer is configured to stop propagation of microcracks from being generated in the handle substrate by the laser radiation.

2. The method of claim 1, further comprising:

splitting the wafer composite along the focal plane.

3. The method of claim 1, wherein a portion of the handle substrate extending from the first main surface of the handle substrate to the focal plane includes single crystalline silicon carbide.

4. The method of claim 1, wherein the laser radiation forms modified zones along parallel laser scan lines, wherein neighboring laser scan lines have a center-to-center distance, and wherein a distance between the focal plane and the auxiliary layer is in a range from 3.2% to 7.25% of the center-to-center distance.

5. The method of claim 1, wherein the auxiliary layer comprises at least one compressively stressed layer.

6. The method of claim 1, wherein the auxiliary layer has a melting point above 1800° C.

7. The method of claim 1, wherein the auxiliary layer comprises single-crystalline silicon carbide, and wherein a mean dopant concentration in the auxiliary layer is higher than a mean dopant concentration in at least a layer portion of the handle substrate along the first main surface.

8. The method of claim 1, wherein providing the wafer composite comprises:

forming the auxiliary layer on at least one of the first main surface of the handle substrate and a working surface of a silicon carbide donor substrate; and connecting the handle substrate and the silicon carbide donor substrate such that the auxiliary layer is arranged between the handle substrate and the silicon carbide donor substrate.

9. The method of claim 8, further comprising:

after the connecting, separating a reclaim portion of the silicon carbide donor substrate from a transfer portion of the silicon carbide donor substrate, wherein the transfer portion forms at least a part of the silicon carbide structure.

10. The method of claim 9, further comprising:

forming an epitaxial layer on the transfer portion.

11. The method of claim 1, wherein the handle substrate comprises a main portion, a separation layer formed over the main portion, and an intermediate layer over the separation layer, and wherein the focal plane is in the intermediate layer.

12. The method of claim 11, wherein the intermediate layer is formed by layer transfer from the silicon carbide donor substrate or from an alternative donor substrate.

* * * * *